US006538339B2

(12) United States Patent
Krizek et al.

(10) Patent No.: US 6,538,339 B2
(45) Date of Patent: Mar. 25, 2003

(54) POWER GENERATION SYSTEM INTERCHANGEABILITY DEVICE AND RELATED METHODS

(75) Inventors: James J. Krizek, Charlotte, NC (US); Christopher W. Ross, Oviedo, FL (US); Lon W. Montgomery, Winter Springs, FL (US); James R. Pipkin, Maitland, FL (US)

(73) Assignee: Siemens Westinghouse Power Corporation, Orlando, FL (US)

( * ) Notice: Subject to any disclaimer, the term of this patent is extended or adjusted under 35 U.S.C. 154(b) by 0 days.

(21) Appl. No.: 09/797,069

(22) Filed: Feb. 28, 2001

(65) Prior Publication Data

US 2001/0033081 A1 Oct. 25, 2001

Related U.S. Application Data

(60) Provisional application No. 60/186,306, filed on Mar. 2, 2000.

(51) Int. Cl.[7] .................... H02K 11/00; H02K 1/32; H02K 3/24; H02K 5/18; H02K 5/20; H02K 9/00
(52) U.S. Cl. ................... 290/1 A; 310/71; 310/64
(58) Field of Search ................. 290/1 R, 1 A

(56) References Cited

U.S. PATENT DOCUMENTS

| | | | |
|---|---|---|---|
| 2,507,242 A | 5/1950 | Bost | 173/324 |
| 2,727,215 A * | 12/1955 | Brown | 439/53 |
| 2,728,002 A | 12/1955 | Turner | 310/71 |
| 3,612,786 A * | 10/1971 | Whitman | 200/11 TC |
| 3,903,441 A | 9/1975 | Towne | 310/71 |
| 3,980,910 A | 9/1976 | Steinebronn et al. | 310/71 |
| 4,029,978 A | 6/1977 | Jäger et al. | 310/64 |
| 4,140,934 A | 2/1979 | Jäger et al. | 310/71 |
| 4,172,984 A | 10/1979 | Daugherty et al. | 310/71 |
| 4,199,700 A | 4/1980 | Daugherty et al. | 310/71 |
| 4,254,352 A | 3/1981 | Fidei et al. | 310/71 |
| 4,488,072 A | 12/1984 | Archibald et al. | 310/71 |
| 4,754,179 A | 6/1988 | Capuano et al. | 310/71 |
| 4,806,807 A | 2/1989 | Levino | 310/71 |
| 4,866,316 A | 9/1989 | Humphries | 310/71 |
| 4,894,575 A | 1/1990 | Nilsson et al. | 310/260 |
| 4,943,749 A | 7/1990 | Ponce et al. | 310/260 |
| 5,293,091 A * | 3/1994 | Edwards et al. | 310/71 |
| 5,532,432 A * | 7/1996 | Ishikawa | 174/60 |
| 5,539,614 A * | 7/1996 | Ishikawa et al. | 361/603 |
| 5,691,686 A * | 11/1997 | Ishikawa et al. | 336/174 |
| 5,814,912 A | 9/1998 | Ross | 310/71 |
| 5,889,450 A * | 3/1999 | Kim et al. | 335/18 |
| 5,949,167 A | 9/1999 | Blalock et al. | 310/71 |
| 6,362,445 B1 * | 3/2002 | Marchand et al. | 218/155 |

FOREIGN PATENT DOCUMENTS

DE 19748587 A1 5/1999

* cited by examiner

*Primary Examiner*—Nestor Ramirez
*Assistant Examiner*—Pedro J. Cuevas

(57) ABSTRACT

A power generation system (40) including an interchangeability component connecting device is provided. The system preferably includes an outer housing (60), an inner housing (50), a power generator (70), interchangeable main and neutral leads (102, 116), main side (84) and neutral side (94) current transformers assembled on the respective main and neutral leads, and lead connector interfaces (130, 140) having a plurality of lead connectors (135, 145) are provided. The lead subassemblies (80, 90) preferably include lead subassembly platforms (82, 92) having main leads (102) with main side current transformers (84) and neutral leads (116) with neutral side (94) current transformers positioned thereon The main (102) and neutral (116) leads are interchangeably connected to first (72) and second (74) side portions of the power generator (70). The present invention also provides methods of interchangeably installing main (102) and neutral (116) leads to first (72) and second (74) side portions of the power generator (70). The present invention further provides methods of installing the main leads (102) in a second configuration such that with no change to the power generator (70), the phase sequence delivered at the power connections will be reversed as compared to a first configuration.

16 Claims, 12 Drawing Sheets

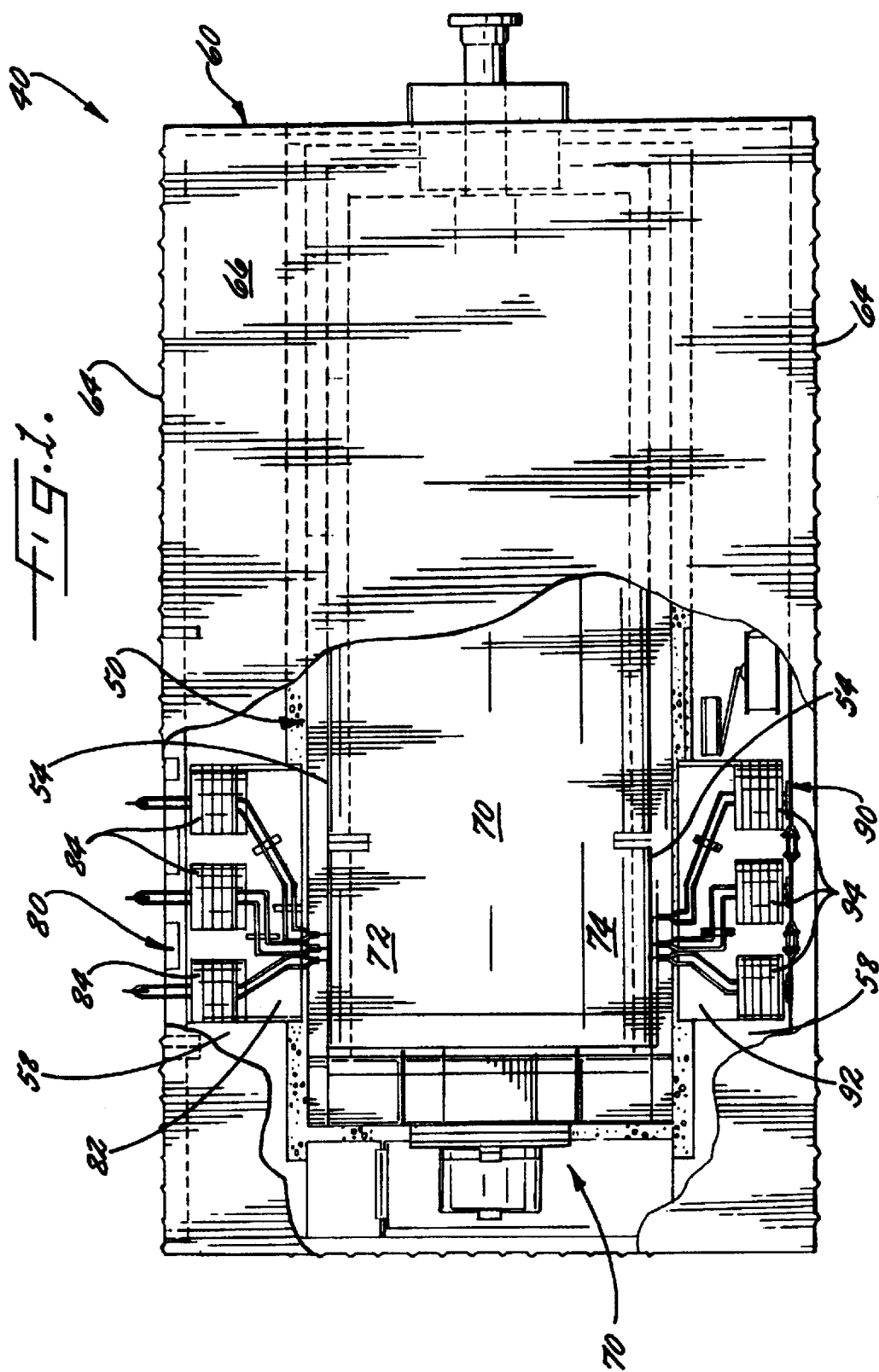

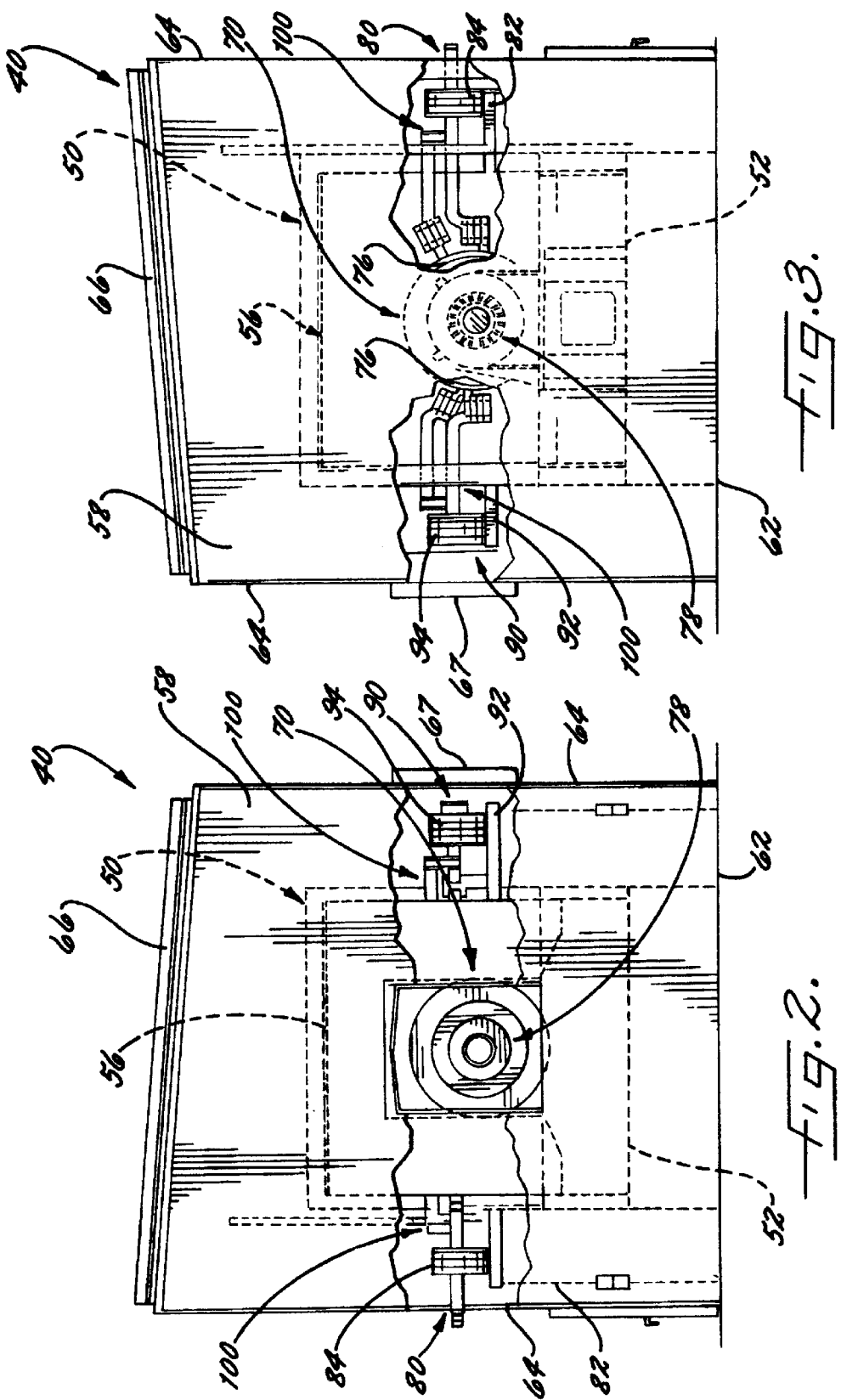

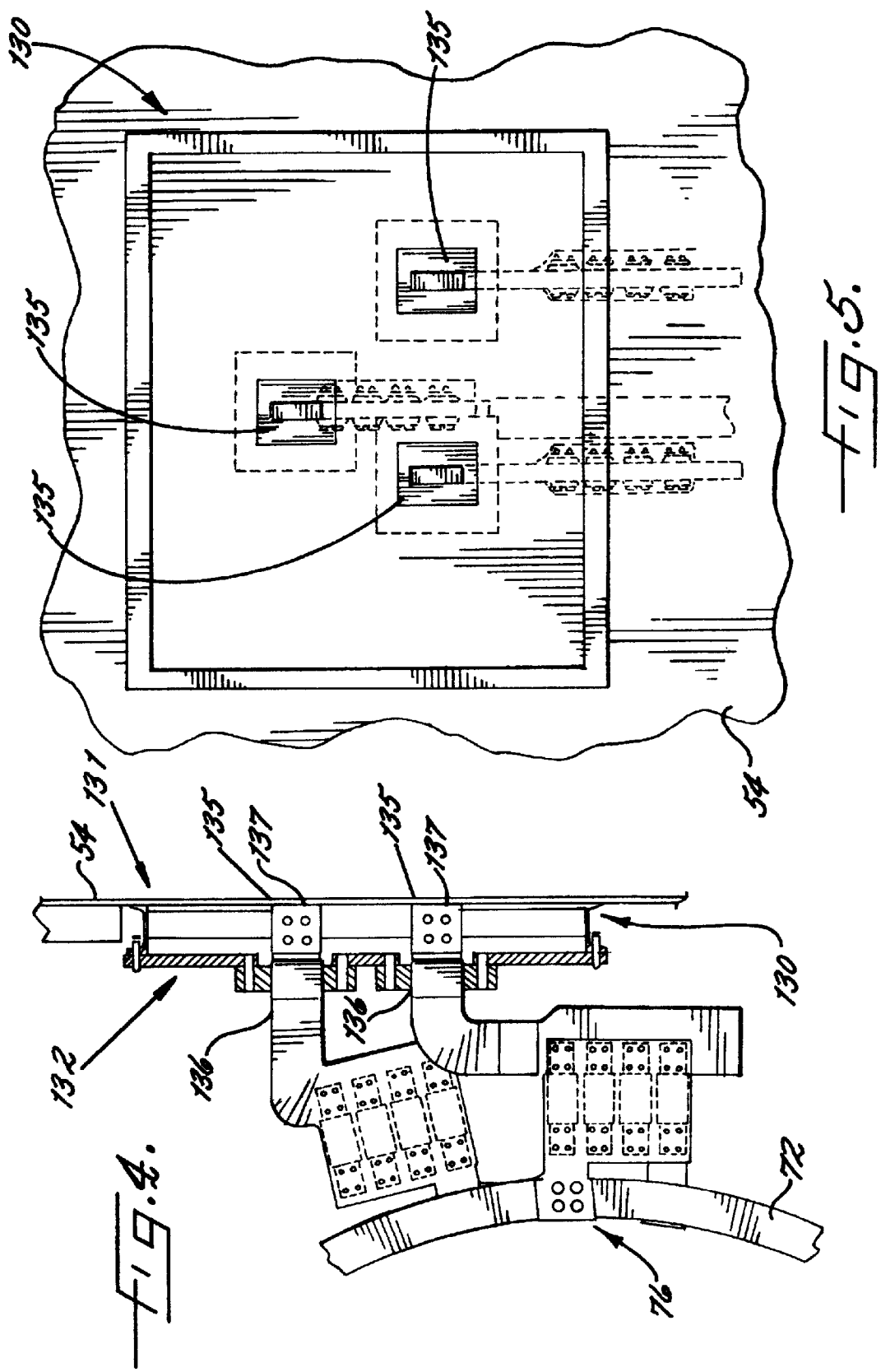

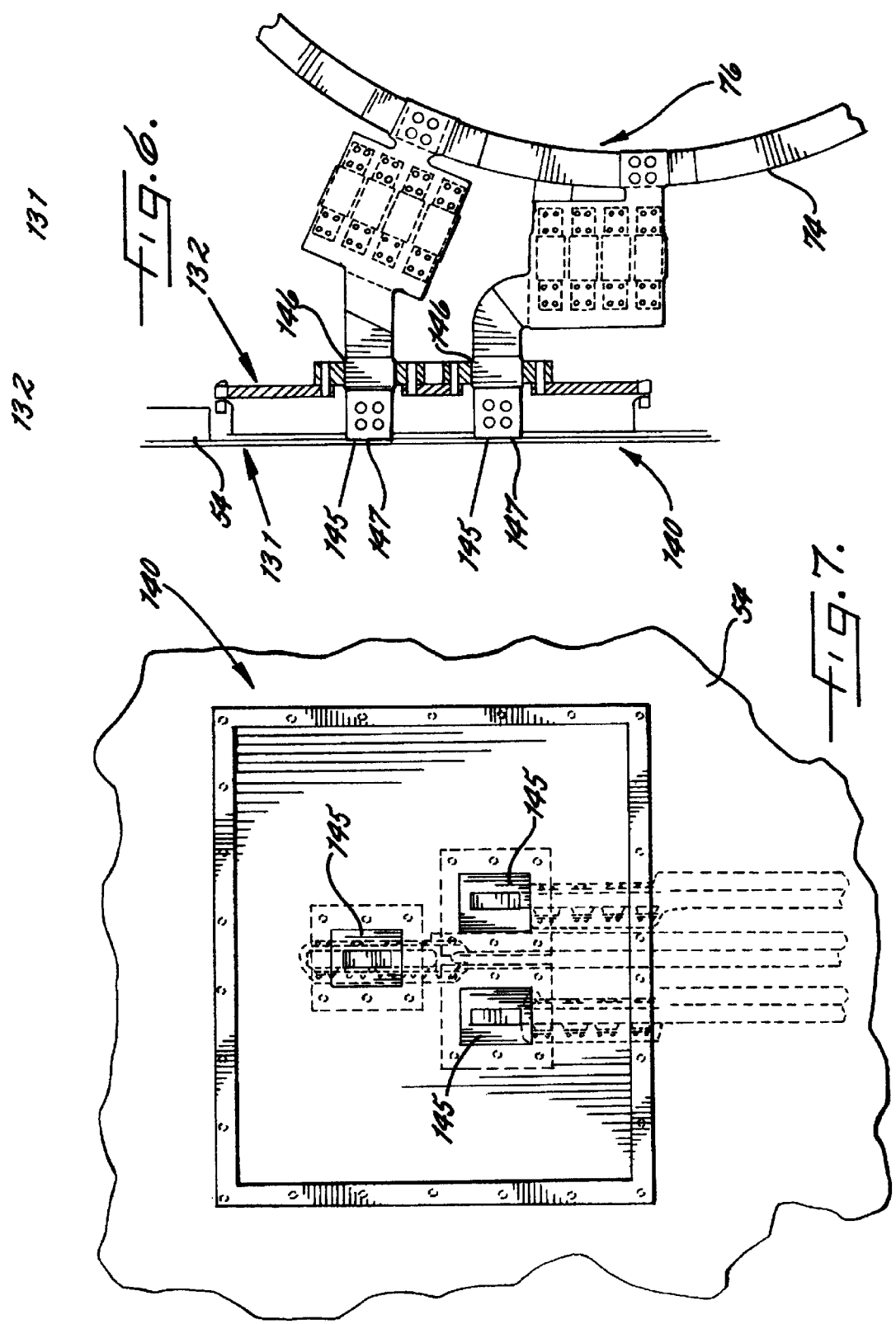

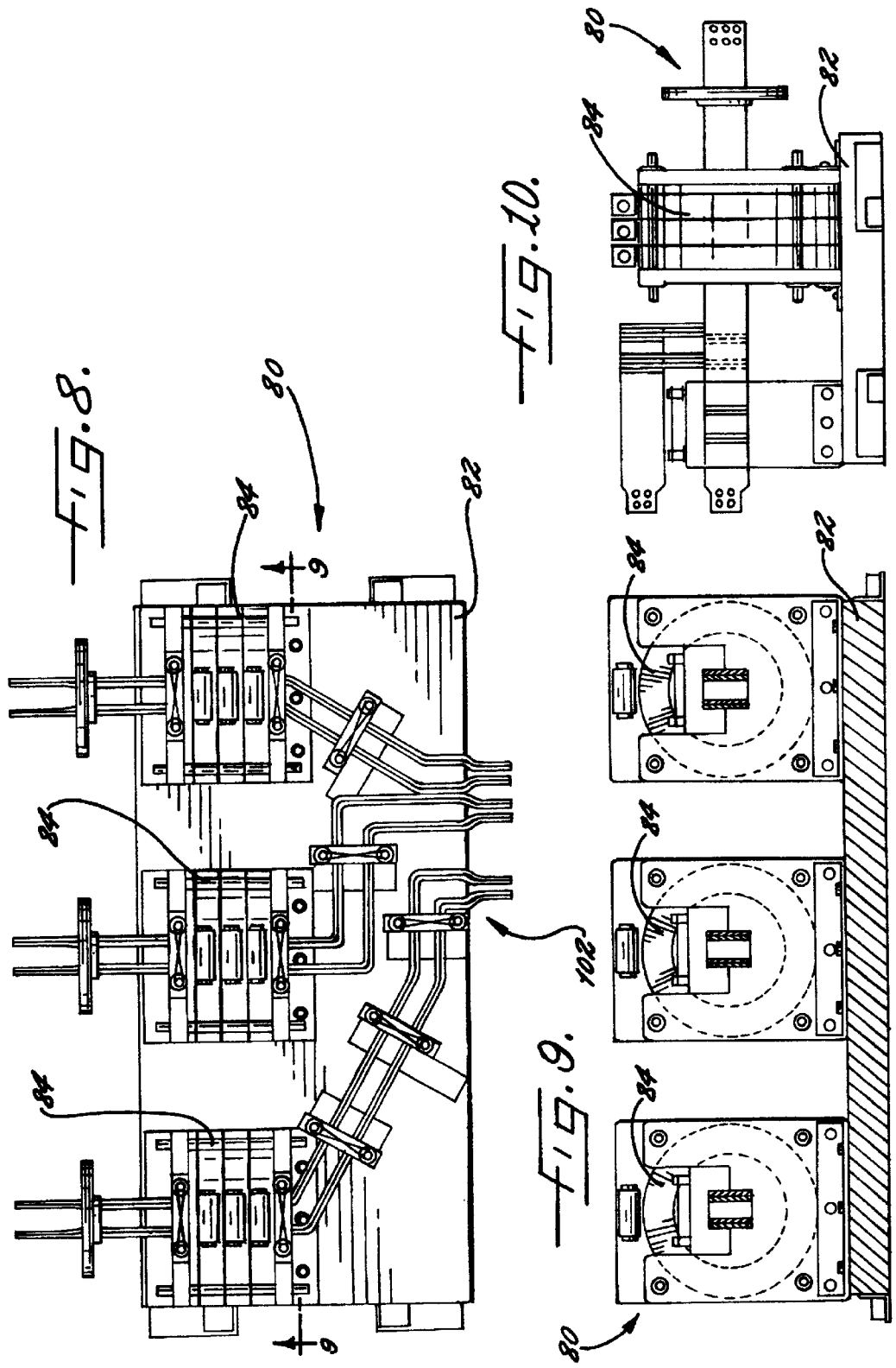

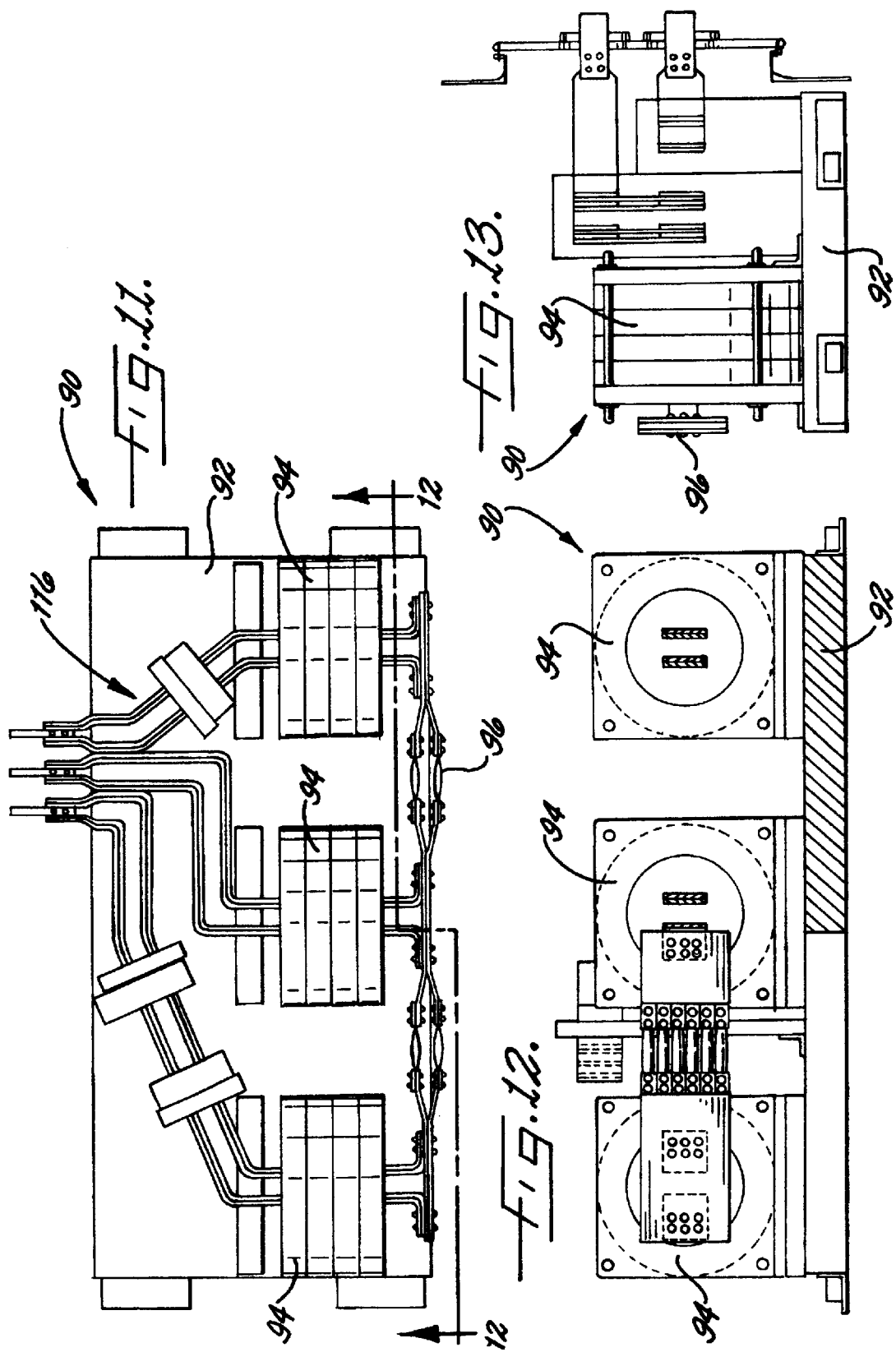

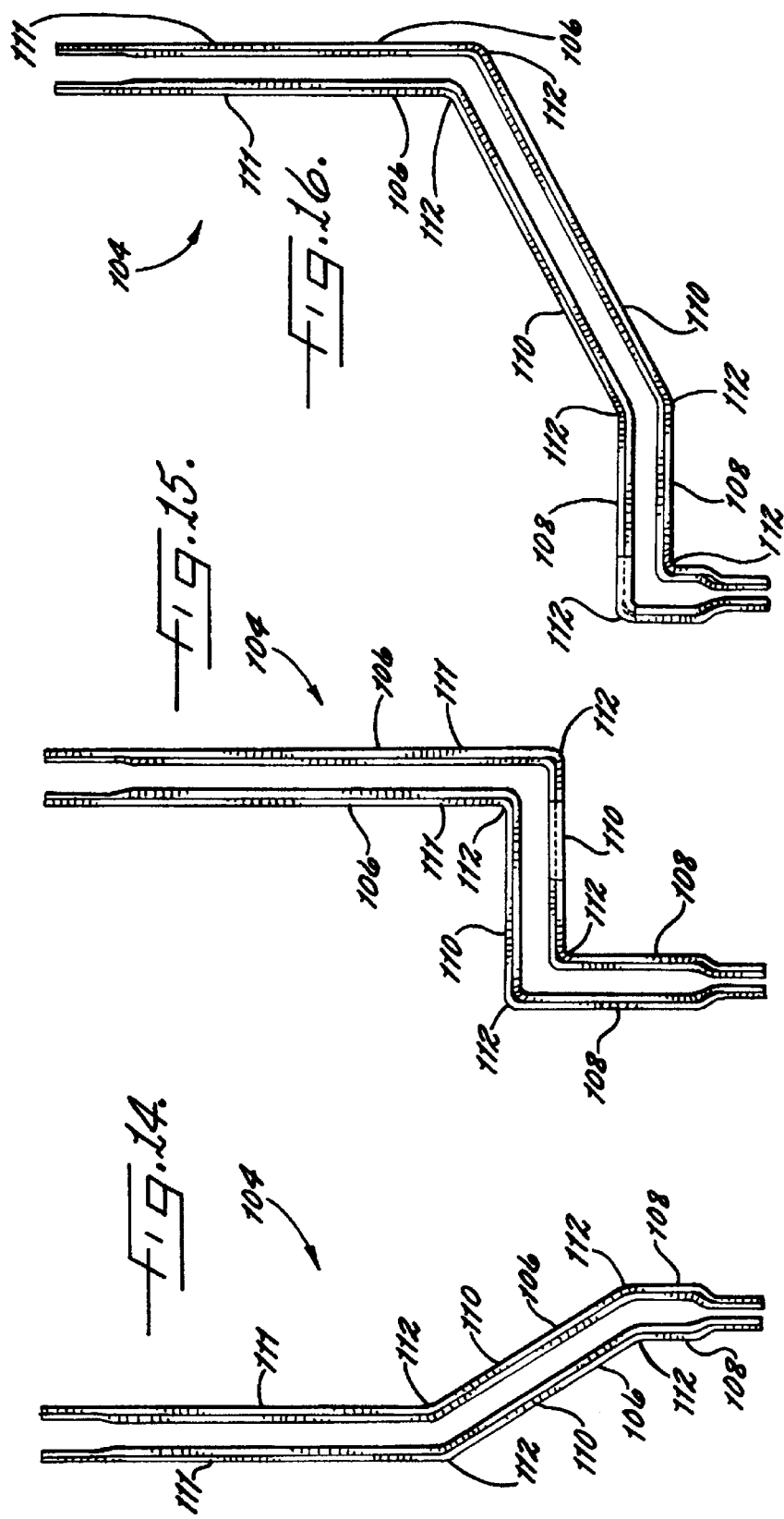

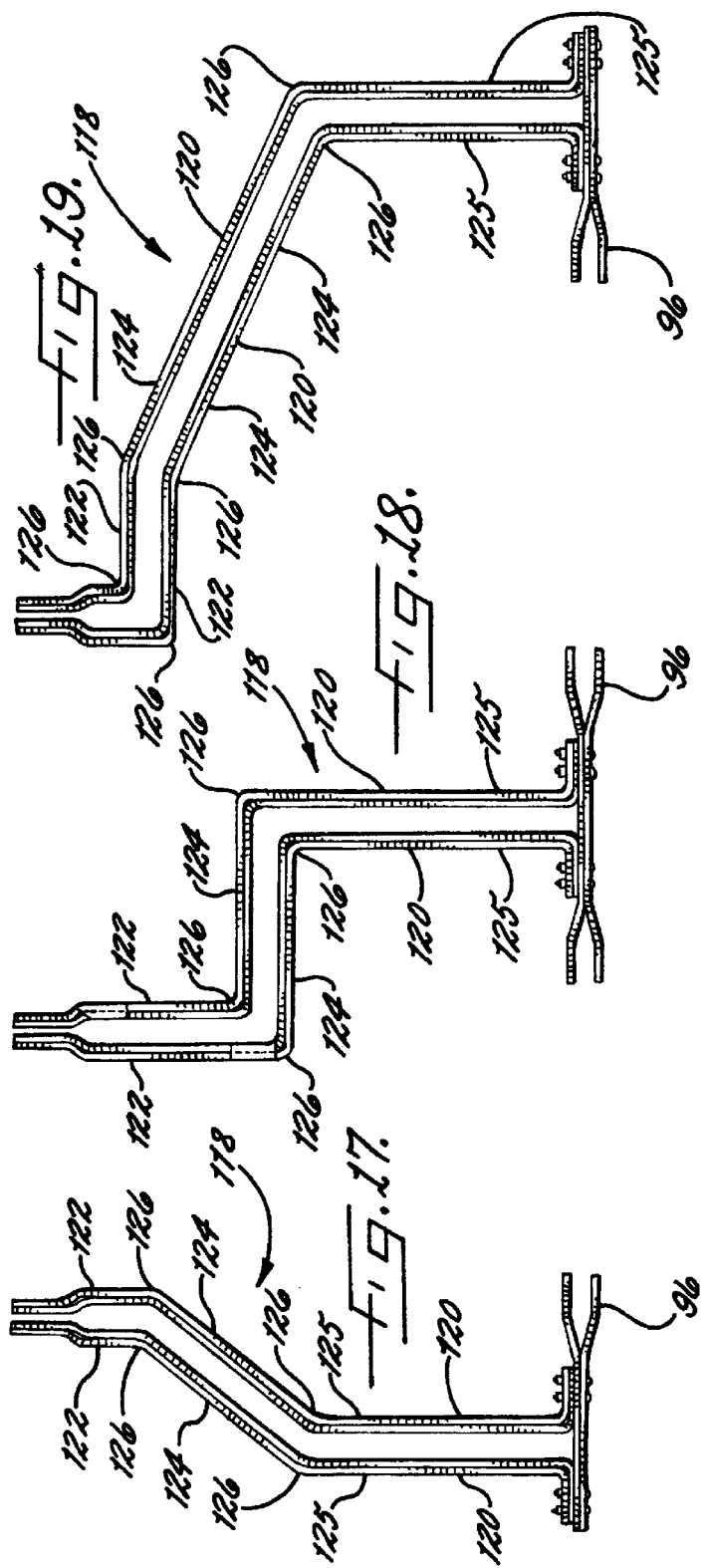

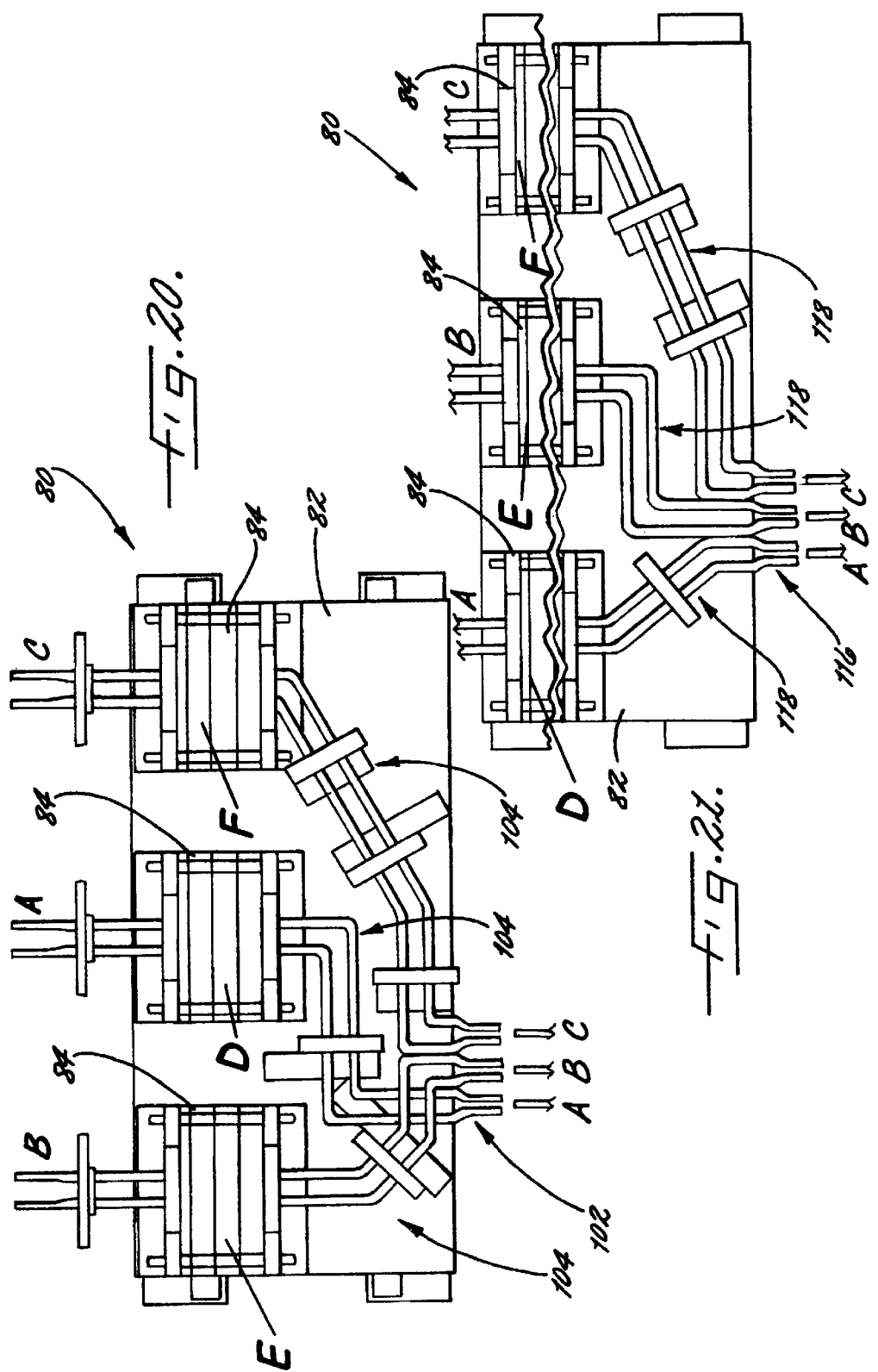

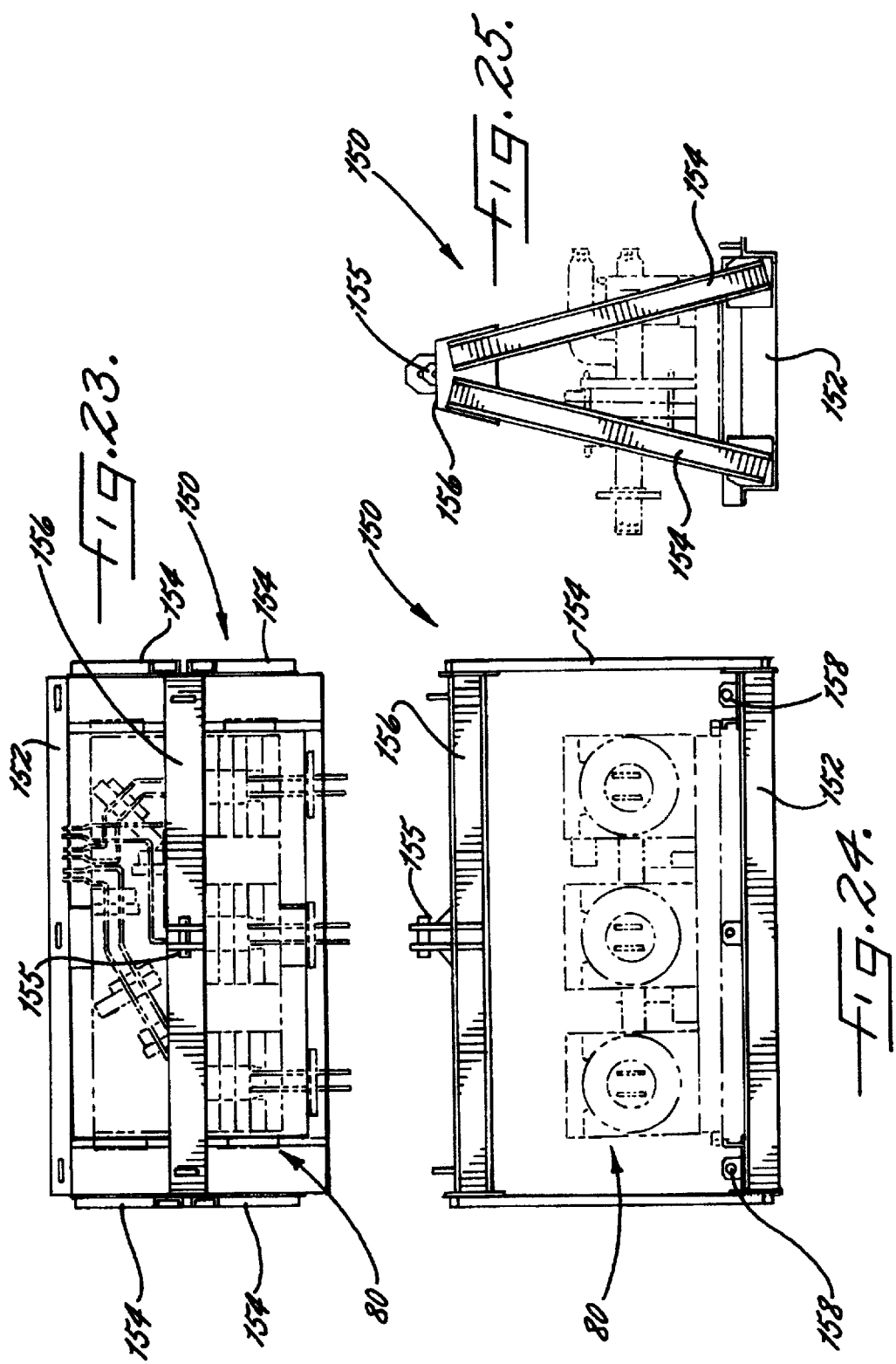

POWER GENERATION SYSTEM INTERCHANGEABILITY DEVICE AND RELATED METHODS

RELATED APPLICATIONS

This application claims the benefit of U.S. Provisional Application Serial No. 60/186,306 filed on Mar. 2, 2000.

FIELD OF THE INVENTION

The present invention relates to the power generation industry and, more particularly, to the field of power generators and methods of installing same.

BACKGROUND OF THE INVENTION

Conventionally, the construction of power generation systems must be planned out far in advance and great caution must be taken to insure that the construction of the power generation system is performed with precise detail. Normally, main and neutral leads, and the associated current transformers, are associated with a particular side portion of a power generator. Further, in conventional power generation systems, the connections for the main and neutral leads are positioned on preselected side portions of the power generator as the power generator is constructed on site. The main and neutral lead assemblies are often shipped to the site pre-configured to be connected to one particular side of the power generator. This arrangement is disadvantageous because the main and neutral lead assemblies are restricted to being connected to one specific side portion of the power generator, e.g., an air-cooled power generator. In cases when main or neutral lead assemblies are shipped to a site pre-configured to be connected to the incorrect side, e.g., the main lead assembly is shipped to the site configured to be connected to the "right" side portion of the power generator, but the power generator is configured for connecting the main lead assembly to the "left" side portion, the only recourse is to delay the project and either reconfigure the connections to be compatible with the main lead assemblies or ship different main or neutral lead assemblies having the proper configuration for connecting to the power generator. This process can prove to be time consuming, costly, and inefficient.

Some air cooled power generators incorporate a phase sequence of a three phase voltage output for three main leads in a generator lead box as seen in U.S. Pat. No. 4,866,316 by Humphries et al. titled "Method and Apparatus For Changing the Phase Sequence of a Completed Generator." The main leads in Humphries '316, advantageously interconnect three axially aligned pairs of connectors that are reversible by the utilization of crossed main leads between two adjacent pairs of connectors. Although this configuration is advantageous, it only allows for the interchangeability of the phase connectors restricted to one side of the power generator. Therefore, once the power generator is positioned in place, the leads must be connected to a particular side of the power generator. This configuration, although advantageous for interchangeably connecting the phase sequence of a completed generator, can be disadvantageous because it is costly, time consuming, and inefficient if a change is required in the side portion of the power generator on which the main or neutral lead assembly is to be connected.

SUMMARY OF THE INVENTION

With the foregoing in mind, the present invention advantageously provides a power generation system and methods which provides interface connectors for interchangeably connecting a plurality of leads between a power generator and main and neutral current transformers. The power generation system and methods of the present invention advantageously eliminate time delays and costs associated with reconfiguring a power generation system in order to change positions of interface connectors and the plurality of leads for connecting main and neutral current transformers to the power generator. The system and methods of the present invention also advantageously allow customers to order a power generator and main and neutral current transformers without the need to commit to a particular arrangement for the plurality of leads and the interface connectors for connecting the main and neutral current transformers to the power generator. The present invention further advantageously allows the arrangements of the interface connectors and the plurality of leads to be interchanged between the main and neutral current transformers and the power generator at an installation site after the components have been shipped from the manufacturing facility. The system, methods, and tools of the present invention also advantageously allow for fast and simplified installation of components onto portions of the power generator.

More particularly, the present invention provides a power generation system having an outer housing and an inner housing positioned substantially within the outer housing. An interstitial space is formed between inner surface portions of the outer housing and outer surface portions of the inner housing. The power generation system also advantageously includes a power generator having first and second side portions and that is positioned substantially within the inner housing. A plurality of main current transformers are advantageously positioned in the interstitial space between the outer housing and the inner housing and associated with one of the respective first or second side portions of the power generator to transform current received from the power generator to a preselected output. A plurality of neutral current transformers are positioned in the interstitial space between the outer housing and the inner housing and associated with one of the respective first or second side portions of the power generator. Each of the plurality of neutral current transformers is-positioned substantially opposite each of the plurality of main current transformers to transform current received from the power generator.

The power generation system further advantageously includes a pair of lead connector interfaces. Each of the lead connector interfaces is connected to first and second opposing sidewalls of the inner housing. Each one of the respective first and second lead connector interfaces includes a plurality of connectors, positioned on first and second sides of the lead connector interfaces. The plurality of connectors positioned on the first one of the pair of lead connector interfaces is positioned in substantially the same locations as the plurality of connectors positioned on the second one of the pair of lead connector interfaces so that the pair of lead connector interfaces is substantially similar in configuration and can thereby readily interchangeably and electrically connect, e.g., through magnetic induction, one of the plurality of the respective main or neutral current transformers to one of the respective first or second side portions of the power generator.

The plurality of main and neutral current transformers positioned on a platform is extremely large and cumbersome. The movement and positioning of the plurality of main and neutral current transformers can be expensive and time consuming. In cases where the positions for the connections of the main and neutral current transformers are not properly planned for, the connections on the plurality of main and neutral current transformers must be re-positioned in order to connect to the proper side portions of the power generator.

The present invention also advantageously provides a method of installing interchangeable main and neutral lead assemblies for a power generation system. The method includes the step of preselecting a first and a second position along opposing side portions of a power generator constructed at an installation site to connect respective main and neutral lead assemblies thereto at the installation site. The method also includes the step of changing the preselected positions where the respective main and neutral current lead assemblies are connected along the side portions of the power generator after the respective main and neutral lead assemblies are shipped from a manufacturing facility and arrive at the installation site. The method of changing the preselected positions is performed with a plurality of similarly configured leads associated with the respective main and neutral sides of a power generator and a plurality of similarly configured lead connector interfaces also associated with the respective first and second side portions of the power generator. The method of installing the interchangeable main and neutral current transformers also includes the step of connecting the main or neutral lead assemblies to the opposing side portions of the power generator. The method of installing the main and neutral lead assemblies advantageously eliminates high costs and time delays associated with rearranging the positions of connections between the power generator and the main and neutral lead assemblies.

Therefore, the power generation system and methods of the present invention advantageously provide an avenue for interchanging the positions of interface connectors and a plurality of leads for connecting the main and neutral current transformers to alternate side portions of the power generator, when desired or necessary. The power generation system and methods of the present invention also advantageously allow for more schedule and budgetary flexibility in the construction and installation of power generators. The present invention further advantageously allows more freedom in scheduling and production matters that occur in the generator manufacturing facility. The power generation system, methods, and tools of the present invention further advantageously provide an installation tool to increase the efficiency of the installation of components to the power generator.

BRIEF DESCRIPTION OF THE DRAWINGS

Some of the features, advantages, and benefits of the present invention having been stated, others will become apparent as the description proceeds when taken in conjunction with the accompanying drawings in which:

FIG. 1 is a top plan view of a power generation system having portions adjacent main and neutral lead assemblies thereof broken away for clarity according to the present invention;

FIG. 2 is a left side elevational view of a power generation system having portions adjacent main and neutral lead assemblies thereof broken away for clarity according to the present invention;

FIG. 3 is a right side elevational view of a power generation system having portion adjacent main and neutral lead assemblies thereof broken away for clarity according to the present invention;

FIG. 4 is a fragmentary front elevational view of a plurality of conductors extending from a first side portion of a power generator to a connector interface positioned in a first sidewall of an inner housing according to the present invention;

FIG. 5 is a fragmentary side elevational view of a connector interface connected to the first sidewall of the inner housing according to the present invention;

FIG. 6 is a fragmentary front elevational view of a plurality of conductors extending from a second side portion of the power generator to a connector interface positioned in a second sidewall of the inner housing according to the present invention;

FIG. 7 is a fragmentary side elevational view of a connector interface connected to the second sidewall of the inner housing opposite the first sidewall of the inner housing according to the present invention;

FIG. 8 is a top plan view of a main lead assembly platform having a plurality of current transformers and main leads supported thereon according to the present invention;

FIG. 9 is a sectional view of a plurality of main side current transformers positioned on a main lead assembly platform and taken along line 9—9 of FIG. 8 according to the present invention;

FIG. 10 is a front elevational view of one of a plurality of main side current transformers positioned on a main lead subassembly platform and having a plurality of main leads supported on the platform and passing through the plurality of main side current transformers according to the present invention;

FIG. 11 is a top plan view of a neutral lead assembly platform having a plurality of neutral side current transformers and a plurality of neutral leads supported thereon according to the present invention;

FIG. 12 is a sectional view of the plurality of neutral side current transformers positioned on a neutral lead assembly platform and taken along line 12—12 of FIG. 11 according to the present invention;

FIG. 13 is a front elevational view of one of the plurality of neutral current transformers positioned on a neutral lead assembly platform and having a plurality of neutral leads associated therewith according to the present invention;

FIG. 14 is a top plan view of a first one of a plurality of main leads connected to one side of a connector interface and associated with one of a plurality of a main side current transformers according to the present invention;

FIG. 15 is a top plan view of a second one of a plurality of main leads connected to one side of a connector interface and associated with one of a plurality of a main side current transformers according to the present invention;

FIG. 16 is a top plan view of a third one of a plurality of main leads connected to one side of a connector interface and associated with one of a plurality of a main side current transformers according to the present invention;

FIG. 17 is a top plan view of a first one of a plurality of neutral leads connected to one side of a connector interface and associated with one of a plurality of neutral side current transformers according to the present invention;

FIG. 18 is a top plan view of a second one of a plurality of neutral leads connected to one side of a connector interface and associated with one of a plurality of neutral side current transformers according to the present invention;

FIG. 19 is a top plan view of a third one of a plurality of neutral leads connected to one side of a connector interface and associated with one of a plurality of neutral side current transformers according to the present invention;

FIG. 20 is a top plan view of a plurality of main leads A, B, and C respectively corresponding to each of the power generators electrical phases and each positioned to pass through one of a plurality of current transformers D, E, and F according to the present invention;

FIG. 21 is a top plan view of a plurality of main leads A, B, and C positioned in a different configuration and respectively corresponding to each of the power generators electrical phases and each positioned to pass through one of a plurality of current transformers D, E, and F according to the present invention;

FIG. 23 is a top plan view of a power generation installation tool having a lead subassembly platform and a plurality of leads and current transformers positioned thereon according to the present invention;

FIG. 24 is a side elevational view of a power generation installation tool having a lead subassembly platform and a plurality of leads and current transformers positioned thereon according to the present invention;

FIG. 25 is a front elevational view of a power generation installation tool having a lead subassembly platform and a plurality of leads and current transformers positioned thereon according to the present invention;

DETAILED DESCRIPTION OF THE PREFERRED EMBODIMENTS

The present invention will now be described more fully hereinafter with reference to the accompanying drawings which illustrate preferred embodiments of the invention. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, the prime notation, if used, indicates similar elements in alternative embodiments.

Figure 26:
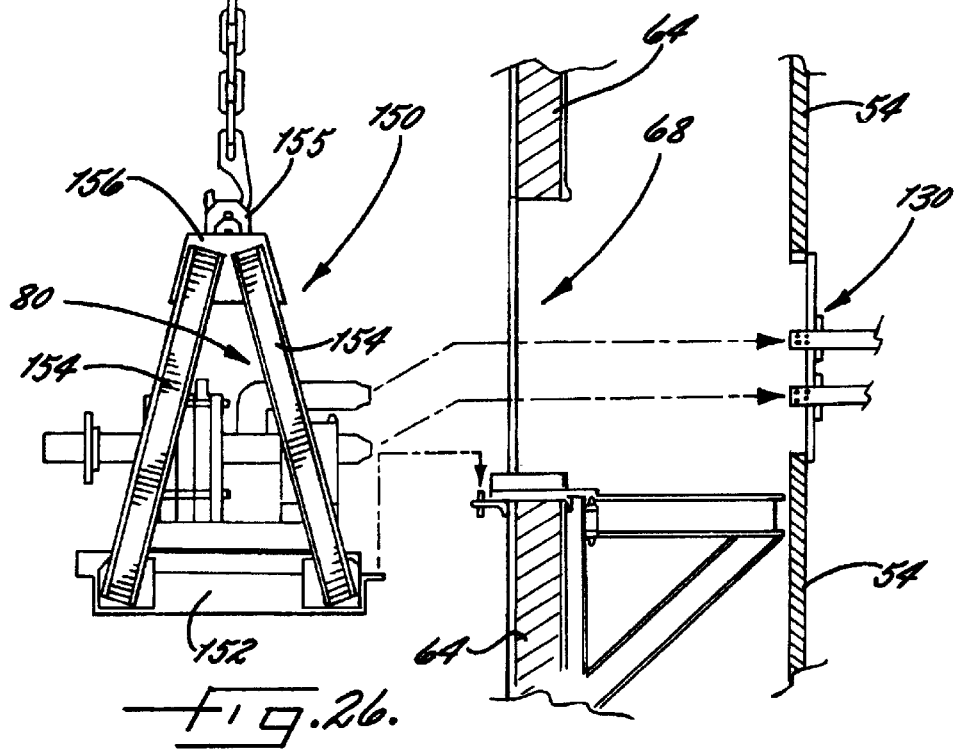
FIG. 26 is a fragmentary front elevational view of a lead subassembly being positioned in place using the power generation installation tool according to the present invention.

Referring to FIGS. 1–3, the present invention advantageously provides a power generation system 40 having an inner housing 50 and an outer housing 60 substantially surrounding the inner housing 50. The outer housing 60 preferably includes a bottom 62, a plurality of sidewalls 64 connected to the bottom 62, and a top 66 connected to each of the plurality of sidewalls 64 and positioned to overlie the bottom 62. The bottom 62 of the outer housing 60 is preferably constructed of concrete material, but any other construction materials having structurally sound properties are also suitable as understood by those skilled in the art. The sidewalls 64 and top 66 of the outer housing 60 are preferably constructed of steel material, but similarly, any other construction materials having structurally sound properties are suitable as understood by those skilled in the art. As best illustrated in FIG. 2, the outer housing 60 includes a plurality of doors 67 positioned along side portions of the outer housing 60 so as to provide access into the outer housing 60. As best illustrated in FIG. 26, the outer housing 60 also advantageously includes openings 68 in the sidewalls 64 wherein equipment can be passed therethrough for installation. The inner housing 50 is preferably positioned substantially within the outer housing 60 and includes a bottom 52, a plurality of sidewalls 54 connected to the bottom 52 and a top 56 connected to the plurality of sidewalls 54 and positioned to overlie the bottom 52 of the inner housing 50. The bottom 52 of the inner housing 50 is supported and positioned spaced-apart from the bottom 62 of the outer housing 60. An interstitial space 58 is formed between inner surface portions of the outer housing 60 and outer surface portions of the inner housing 50. At least the sidewalls 54 of the inner housing 50 and particularly portions adjacent or forming the interface connectors are preferably formed of an insulating material such as various forms of glass or other insulating materials as understood by those skilled in the art.

The inner housing 50 is preferably positioned substantially within the outer housing 60 and includes a bottom 52, a plurality of sidewalls 54 connected to the bottom 52 and a top 56 connected to the plurality of sidewalls 54 and positioned to overlie the bottom 52 of the inner housing 50. The bottom 52 of the inner housing 50 is supported and positioned spaced-apart from the bottom 62 of the outer housing 60. An interstitial space 58 is formed between inner surface portions of the outer housing 60 and outer surface portions of the inner housing 50. At least the sidewalls 54 of the inner housing 50 and particularly portions adjacent or forming the connector interfaces are preferably formed of an insulating material such as various forms of glass or other insulating materials as understood by those skilled in the art. The portions surrounding the connector interfaces can be formed of steel or other materials.

Referring to FIGS. 2–3, the power generation system 40 also includes a power generator 70 that is preferably positioned substantially within the inner housing 50. The power generator 70 includes a longitudinal axis and side portions that are positioned along the longitudinal axis. The power generator also includes a rotor 78 and a multi-phase stator 76 for providing current in multiple phases and surrounding a magnetic portion of the rotor 78 which magnetically transfers the rotational energy produced by the prime mover (or turbine as understood by those skilled in the art) to the stator 76. The stator 76 also includes a longitudinal axis defining a first side portion and a second side portion on opposite sides of the longitudinal axis of the stator 76 with one or the other side being designated the neutral lead side and the opposite side being designated the main lead side. The stator 76 has multiple independent sets of windings which are energized in sequence by one or more rotating magnetic fields of the rotor 78 thereby producing multiple phases of current with each phase requiring independent leads. The power generator 70 can advantageously be an air cooled power generator as understood by those skilled in the art. The air cooled power generator advantageously allows air to circulate within the inner housing 50 to cool the power generation process.

As illustrated in FIGS. 8–13, the power generation system 40 also preferably includes first 80 and second 90 lead assemblies or subassemblies. The first lead assembly 80 is positioned in the interstitial space 58 between the outer housing 60 and a first one of the plurality of sidewalls 54 of the inner housing 50. The first lead assembly 80 includes a first lead subassembly platform 82 having a plurality of current transformers 84, e.g., main side current transformers, positioned thereon. As perhaps best illustrated in FIG. 8, the first lead subassembly platform 82 preferably has a rectangular shape, for example, or any other shape, and can advantageously be stainless steel, for example, or any other material suitable to support the plurality of main side current transformers 84 (as well as a plurality of main leads) as understood by those skilled in the art. Each of the plurality of main side current transformers 84 is associated with, e.g., magnetic induction, side portions of the multi-phase stator 76 to transform current received from a respective one of each of the multiple phases of the multi-phase stator 76 to a preselected output. The plurality of main leads preferably pass through the plurality of main side current transformers as shown and as understood by those skilled in the art.

The second lead assembly or subassembly 90 also is positioned in the interstitial space 58 between the outer housing 60 and a second one of the plurality of sidewalls 54 of the inner housing 50. The second one of the plurality of sidewalls 54 of the inner housing 50 is positioned substantially opposite the first one of the plurality of sidewalls 54 of the inner housing 50 so that the second lead assembly 90 is positioned substantially opposite the first lead assembly 80. The second lead assembly 90 includes a second lead assembly platform 92 having a plurality of current transformers 94, e.g., neutral side current transformers, (as well as a plurality of neutral leads) positioned thereon. As perhaps best illustrated in FIG. 11, the second lead assembly platform 92 also can have a rectangular shape, for example, or any other shape, and can advantageously be stainless steel, for example, or any other material suitable to support the plurality of neutral current transformers 94 as understood by those skilled in the art. Both the platforms 82, 92 also preferably support the plurality of leads by a supportive mount, a fastener, a collar, or other device which preferably has at least portions thereof formed of an insulative material. Each of the plurality of neutral side current transformers 94 is associated with, e.g., through magnetic induction, to another side portion of the multi-phase stator 76 that is positioned substantially opposite the side portion where the plurality of main side current transformers 84 are located. The plurality of neutral side current transformers 94 are positioned to transform current from a respective one of each of the multiple phases of the multi-phase stator 76.

Each of the respective plurality of main 84 or neutral 94 side current transformers are advantageously positioned spaced-apart from the other of the respective plurality of main 84 or neutral 94 side current transformers, as perhaps best illustrated in FIGS. 8-13. Each of the plurality of main 84 or neutral 94 side current transformers are connected to a portion of the respective first 82 or second 92 lead subassembly platforms that is distal from the outer surface portions of one of the plurality of inner housing sidewalls 54. The plurality of main 84 or neutral 94 side current transformers can advantageously be connected to the respective plurality of first 82 or second 92 lead subassembly platforms using bolts, for example, that are passed through bottom portions of each of the plurality of main 84 or neutral 94 side current transformers and into portions of the respective first 82 or second 92 lead subassembly platforms to thereby secure the main 84 or neutral 94 side current transformers onto the respective first 82 and second 92 lead subassembly platforms.

FIGS. 11–13 show the plurality of neutral current side transformers 94 having a plurality of neutral leads which pass through the transformers and include a plurality neutral flexible connectors 96 positioned on an end portion of the leads. Each of the plurality of neutral flexible connectors 96 are positioned to matingly connect to each other to thereby form a connection between each of the plurality of neutral leads passing through the plurality of neutral side current transformers 94.

The power generation system 40 also preferably includes lead subassembly interchangeability connecting means 100, e.g., preferably provided by a pair of lead assembly interchangeable connectors, positioned between the respective plurality of main 84 and neutral 94 side current transformers and the respective first and second side portions of the stator 76 of the power generator. The lead subassembly interchangeability connecting means 100 can be an interchangeability connecting device, such as a pair of lead assembly interchangeability connectors. The lead assembly interchangeability connecting means 100 advantageously interchangeably connects, a respective one of the plurality of main or neutral leads to a respective first or second side portion of the multi-phase stator 76. As illustrated in FIGS. 4 and 6, the lead assembly interchangeability connecting means 100 preferably includes a pair of lead connector interfaces 130, 140. The lead connector interfaces 130, 140 are preferably connected to a respective one of the first and second sidewalls 54 of the inner housing 50 so that each one of the pair of lead connector interfaces 130, 140 passes through the first and second sidewalls 54 of the inner housing 50. A first one 130 of the pair of lead connector interfaces is positioned opposite a second one 140 of the pair of lead connector interfaces. The lead connector interfaces 130, 140 include first 131 and second 132 side portions. The first side 131 of the lead connector interfaces 130, 140 is positioned along an outer surface of one of the respective inner sidewalls 54. The second side 132 of the lead connector interfaces 130, 140 is positioned along an inner surface of one of the respective inner sidewalls 54. The first side 131 is positioned opposite the second side of the lead connector interfaces 130, 140. Each one of the respective first 130 and second 140 lead connector interfaces preferably includes a plurality of connectors 135, 145. The plurality of connectors 135, 145, for example, can be a plurality of lead tabs which are elliptically shaped connectors to which a plurality of leads 104, 118 are connected. The plurality of elliptically shaped connectors 135, 145 are preferably positioned spaced-apart and substantially parallel to each other along surface portions of the first 131 and second 132 sides of the lead connector interfaces 130, 140. The plurality of lead connector interfaces 130, 140 extend through the respective first and second sidewalls 54 of the inner housing 50. The plurality of connectors 135 positioned on the first one of the pair of lead connector interfaces 130, as illustrated in FIG. 4, are positioned in substantially the same locations as the plurality of connectors 145 positioned on the second one of the pair of lead connector interfaces 140, as illustrated in FIG. 6, advantageously making the pair of lead connector interfaces 130, 140 substantially interchangeable. The plurality of connectors 135, 145 positioned on the first side 131 of the lead connector interfaces 130, 140 are electrically connected to the plurality of connectors 135, 145 positioned on the second side 132 of the lead connector interfaces. The plurality of connectors 135, 145 positioned on the first side 131 of the lead connector interfaces 130, 140 are positioned to connect to a plurality of main or neutral leads as illustrated and as understood by those skilled in the art. The plurality of connectors 135, 145 positioned on the second side 132 of the lead connector interfaces 130, 140 are positioned to electrically connect to the first 72 and second 74 side portions of the power generator 70, and more particularly, to the first 72 and second 74 side portions of the multi-phase stator 76. This configuration advantageously provides an interchangeable electrical connection through magnetic induction, e.g., the leads pass through openings in each of the plurality of current transformers without contacting the transformers, between the main 84 and neutral 94 side current transformers and first 72 and second 74 side portions of the power generator 70.

The positioning of these connectors 135, 145 advantageously provide a pair of lead connector interfaces 130, 140 that are substantially similar in configuration. The similar configuration includes the similar positioning of the connectors 135, 145 along each of the pair of lead connector interfaces 130, 140 and the similar positioning of each of the pair of lead connector interfaces 130, 140 along the respective first and second sidewalls 54 of the inner housing 50. The similar configuration of the plurality of connectors 135, 145 and the pair of lead connector interfaces 130, 140 advantageously provides a power generation system 40 wherein the plurality of respective main 84 and neutral 94 current transformers can be interchangeably, electrically connected to one of the respective first 72 or second 74 side portions of the stator.

As illustrated in FIGS. 4 and 6, the plurality of connectors 135, 145 can advantageously be positioned to extend through the pair of lead connector interfaces 130, 140, and have a first side 136, 146 positioned on an interior surface of one of the respective first or second sidewalls 54 of the inner housing 50. The first side 136, 146 of each of the plurality of connectors 135, 145 is also preferably connected to one of the respective first 72 or second 74 side portions of the power generator 70, or more particularly, the multi-phase stator 76. As also illustrated in FIGS. 4 and 6, each of the plurality of connectors 135, 145 also have a second side 137, 147. The second side 137, 147 of each of the plurality of connectors 135, 145 is positioned opposite the first side 136, 146 of each of the plurality of connectors 135, 145 and also positioned on an exterior surface of one of the respective first or second sidewalls 54 of the inner housing 50. The second side 137, 147 of each of the plurality of connectors 135, 145 is preferably associated with a respective one of the plurality of main 84 or neutral 94 side current transformers. The plurality of connectors 135, 145 positioned to connect to and/or extend through the pair of lead connector interfaces 130, 140 advantageously provide an interchangeable connection between each of the respective main and neutral leads and the respective first 72 and second 74 side portions of the stator 76.

As perhaps best illustrated in FIGS. 14–19, the lead assembly interchangeability connecting means 100 further includes a plurality of leads 104, 118. The plurality of leads 104, 118 are defined by first 102 and second 116 sets of the plurality of leads. The leads 102, 116 are connected between the second side 137, 147 of the plurality of connectors positioned on the pair of lead connector interfaces 130, 140 and extending therefrom to one of the respective plurality of main 84 or neutral 94 side current transformers. The main leads, for example, can then extend from the main side current transformers to a control station or other auxiliary equipment as understood by those skilled in the art. The neutral leads, for example, can then extend from the neutral side current transformers after passing therethrough to the flexible connector connected end portions of the leads as illustrated and described above. The leads 104, 118 can advantageously be rigid and formed of a metal material, e.g., copper, as understood by those skilled in the art. Each of the plurality of leads 104, 118 of the first 102 and second 116 sets of leads are advantageously positioned to readily interchangeably connect to one of the first 72 or second 74 side portions of the stator 76 by interchangeably connecting to one of the plurality of connectors 135, 145 on one of the respective pairs of lead connector interfaces 130, 140.

Each of the plurality of leads 104 in the first set of the plurality of leads 102 are associated with one of the plurality of main 84 or neutral 94 side current transformers and connect to the plurality of connectors 135, 145 on the first side 131 of one of the respective first 130 or second 140 lead connector interfaces. Similarly, each of the plurality of leads 118 in the second set of the plurality of leads 116 are associated with one of the respective plurality of main 84 or neutral 94 side current transformers and connect to the second side of one of the plurality of connectors 137, 147 on one of the respective first 130 or second 140 lead connector interfaces. The first set of the plurality of leads 102 are preferably positioned opposite the second set of the plurality of leads 116 and have substantially the same shape as the second set of the plurality of leads 116. This advantageously allows one of the plurality of leads taken from the first 102 or second 116 set of the plurality of leads to be readily interchangeably connected to one of the respective first 130 or second 140 lead connector interfaces.

As illustrated in FIGS. 14–19, each of the plurality of leads of the first 102 or second 116 sets of the plurality of leads further include first 106 and second 120 conductors. The first 106 and second 120 conductors can advantageously be rigid conductors. The conductors 106, 120 can be any type of conductive material as understood by those skilled in the art. The first conductor 106 is positioned spaced-apart from the second conductor 120 and extends substantially parallel from one of the plurality of main 84 or neutral 94 current transformers. Each of the conductors 106, 120 further include first 108, 122, second 110, 124, and third 111, 125 portions. The third portion 111, 125 of each of the conductors 106, 120 is connected to the second portion 110, 124 and extends outwardly from the second portion 110, 124 of the conductor 106, 120 at a preselected angle or bend 112, 126. The second portion 110, 124 of the conductor 106, 120 is connected to the first portion 108, 122 of the conductor 106, 120 and extends outwardly from the first portion 108, 122 of the conductor 106, 120 at a preselected angle or bend 112, 126. The plurality of conductors 106 associated with the plurality of leads in the first set of the plurality of leads that are connected to the first lead connector interface 130 are shaped substantially similar to the corresponding conductors 120 associated with the plurality of leads in the second set of the plurality of leads 116 that are connected to the second lead connector interface 140.

The power generation system 40 of the present invention advantageously provides first 102 and second 116 sets of plurality of leads that are interchangeably connected to the first 130 and second 140 lead connector interfaces. The interchangeability of the first 102 and second 116 sets of the plurality of leads advantageously provides customers the opportunity to order a power generator 70 without commitment to a particular arrangement of main 102 or neutral 116 lead locations. This, in turn, advantageously allows more freedom in scheduling and production matters that occur in the generator manufacturing facility. This power generation system 40 is also advantageous because the lead location and the associated main 84 or neutral 94 side current transformers can advantageously be changed to suit the particular configuration of the lead connection locations of the power generator 70 at the installation site. These advantages decrease the cost and time associated with unmatched lead connection positions to connect to the power generator 70.

The power generation system 40 of the present invention also includes lead subassembly positioning means positioned exterior the outer housing 60 for positioning the first 80 and second 90 lead subassemblies in the interstitial space 58 formed between the inner surface portions of the outer housing 40 and the outer surface portions of the inner housing 50. As best illustrated in FIGS. 23–27, the lead subassembly positioning means include an installation tool 150 to lift each of the first 80 and second 90 lead subassemblies to a preselected elevation. After each of the first 80 and second 90 lead subassemblies are lifted to the preselected elevation, they are interchangeably connected to the first 130 and second 140 lead connector interfaces positioned in the sidewalls 64 of the inner housing 60. The installation tool 150 preferably includes a tool frame. The tool frame of the installation tool 150 includes a bottom support surface 152, a plurality of side frame members 154 connected to the bottom support surface 152, and a top frame member 156 connected to the plurality of side frame members 154. The plurality of side frame members 154 are positioned spaced-apart along outer side peripheries of the bottom support surface 152. The plurality of side frame members 154 are further positioned to extend upward from the outer side peripheries of the bottom support surface 152 to contact the top frame member 156 positioned spaced-apart from the bottom support surface 152. The installation tool 150 advantageously provides balance to each of the respective first 80 and second 90 lead subassembly platforms as they are lifted to the preselected elevation and installed in the interstitial space 58 between the inner 50 and outer 60 housings.

The installation tool 150 advantageously includes a lead subassembly lift connector 155 connected to the top frame member 156. The lift connector 155 also connects to a lifting device 160, as illustrated in FIG. 26, for lifting the installation tool 150 when installing the first 82 or second 92 lead subassembly platforms having the respective plurality of main or neutral leads and a plurality of main or neutral side current transformers positioned thereon to the preselected elevation. The installation tool 150 also advantageously includes a plurality of track guide members 158 connected to and extending upwardly from the bottom support surface 152 of the installation tool frame 150. The first 82 or second 92 lead subassembly platforms slidably contact the track guide members 158 when positioned on the bottom support surface 152 to thereby secure the respective first 82 or second 92 lead subassembly platforms having the respective plurality of main or neutral leads and the plurality of main 84 or neutral 94 side current transformers positioned thereon during lifting and positioning.

Figure 22:
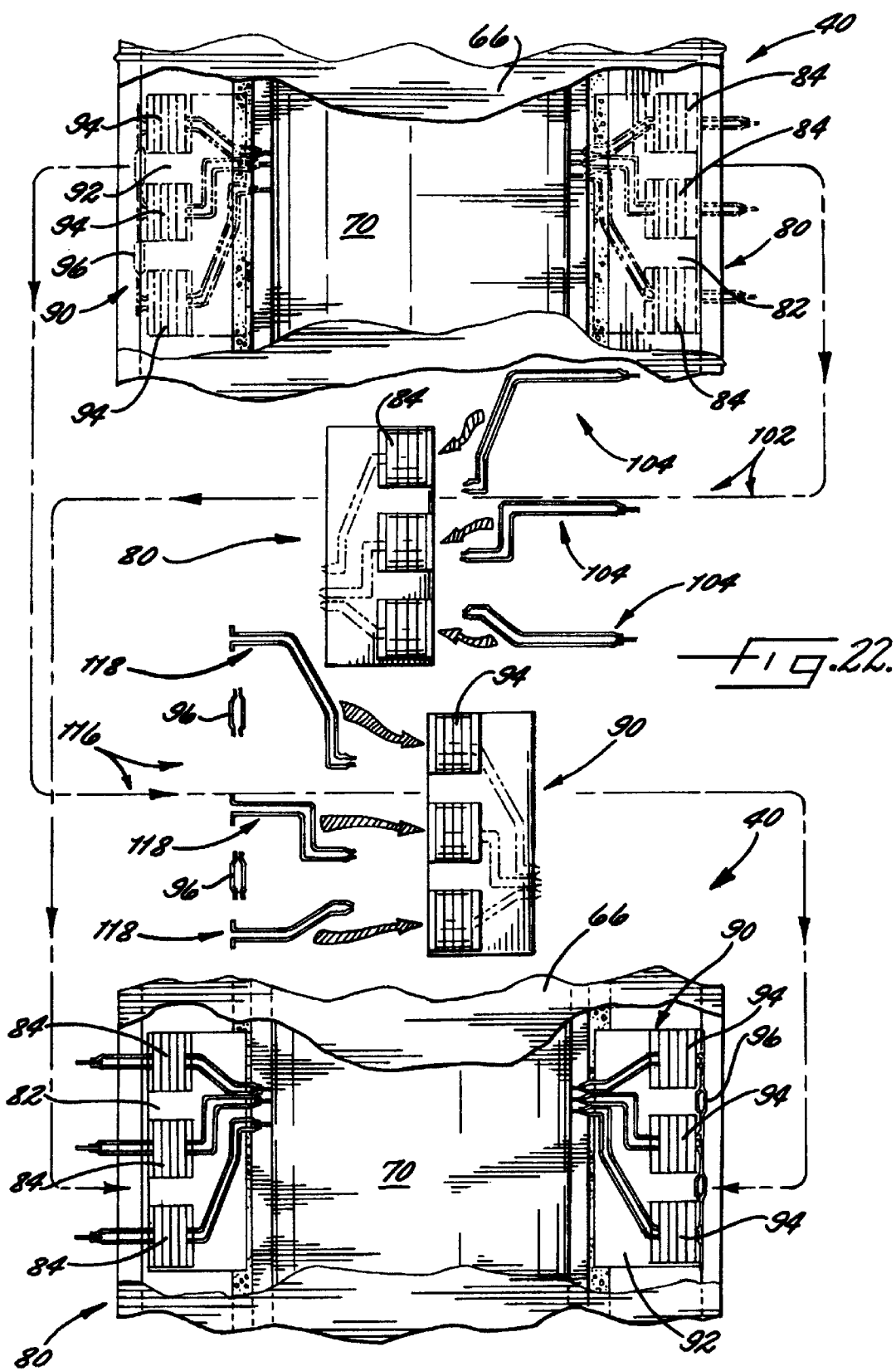
FIG. 22 is a top plan view of the power generation system showing the interchangeability of main and neutral lead assemblies to first or second side portions of the power generator according to the present invention.
Figure 27:
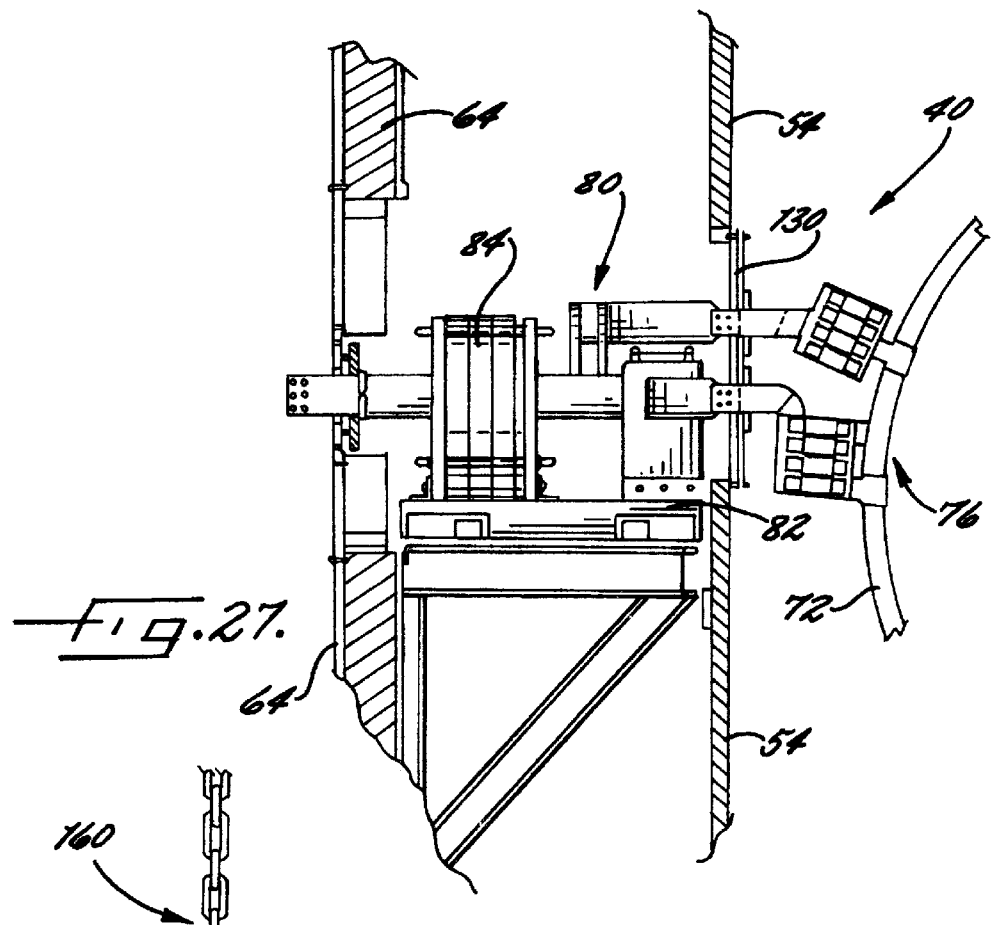
FIG. 27 is a fragmentary front elevational view of a lead subassembly positioned in an interstitial space between an inner housing and an outer housing adjacent a side portion of a power generator according to the present invention.

FIGS. 20–22 further illustrates that the present invention advantageously provides an interchangeability device to interchangeably connect the respective plurality of main and neutral leads to the respective first 72 and second 74 side portions of the power generator 70. FIGS. 20–21, for example, depict a plurality of leads A, B, and C and a plurality of current transformers 84, 94 D, E, and F, having corresponding leads 102, 116 A, B, and C passing therethrough and that can advantageously interchangeably connect to the first 72 or second 74 side portions of the power generator 70. As perhaps best illustrated in FIG. 22, the present invention advantageously provides an avenue for interchangeably connecting the plurality of main or neutral leads to the first 72 or second 76 side portions of the power generator 70.

Customers of the present invention, therefore, may advantageously order a power generator 70, a main lead assembly, and a neutral lead assembly without commitment to a particular arrangement of lead locations, i.e, commitment to positioning the main leads adjacent the left side portion of the power generator 70. The present invention allows the customer to choose the positions where the main and neutral leads are to be electrically connected after the power generator 70 is ordered, delivered and constructed on the installation site. The plurality of main and neutral leads and associated current transformers positioned on the first 82 or second 92 lead subassembly platforms are cumbersome and heavy. The present invention advantageously eliminates the need to move and reconfigure the lead subassemblies 80, 90. The present invention also advantageously allows more freedom in scheduling and production matters that occur in generator manufacturing facilities.

The present invention further includes methods of installing interchangeable main and neutral leads or assemblies for a power generation system 40. The method includes the step of constructing a power generation system 40 at an installation site. The step of constructing the power generation system 40 includes the step of constructing a power generator 70. This method also includes the step of constructing an inner housing 50 to substantially surround the power generator 70 and further includes the step of constructing an outer housing 60 to substantially surround the inner housing 50. The method of installing the interchangeable main and neutral leads includes the step of preselecting a first 72 and a second 74 position along opposing side portions of the power generator 70 to electrically connect respective main 102 and neutral 116 leads thereto at the installation site.

The method of installing the interchangeable main and neutral leads also includes the step of changing the preselected positions 72, 74 where the respective main and neutral leads connected to the side portions 72, 74 of the power generator 70 after the respective plurality of main and neutral leads arrive at the installation site. The positions of the connections are changed with a plurality of similarly configured leads 104, 118 associated with the respective main and neutral lead assemblies and a plurality of similarly configured lead connector interfaces 130, 140 associated with the power generator 70 to electrically connect the respective main or neutral leads to the first 72 or second 74 side portions of the power generator 70.

The leads 104, 118 associated with the main 84 and neutral 94 side current transformers are similarly configured because corresponding leads, i.e., a first one of a plurality of leads 104 associated with the main side current transformer 84 corresponding to a first one of a plurality of leads 118 associated with the neutral side current transformer 94, have similar shapes and sizes. The similar shapes of the first 102 and second 116 corresponding plurality of leads includes similar bends 112, 126 in similar locations along the corresponding plurality of leads 104, 118. Therefore, the leads that are associated with the main side current transformers 84, for example, are suitable for installation on either the first 72 or second 74 side portion of the power generator 70. Similarly, the lead connector interfaces 130, 140 associated with the first 72 and second 74 side portions of the power generator 70 are similarly configured because the corresponding connectors 135, 145, i.e., a first one of the plurality of connectors associated with the first lead connector interface 130 corresponding to a first one of the plurality of connectors associated with the second lead connector interface 140, because the plurality of connectors 135, 145 on both the first 130 and the second 140 lead connector interfaces are positioned in substantially similar locations along the respective first 130 and second 140 lead connector interfaces.

The step of installing the interchangeable main 84 and neutral 94 current transformers for the power generation system 40 can further include shipping a plurality of main and neutral leads or lead assemblies to the installation site having preselected positions 72, 74 for electrically connecting to the power generator 70 along with the first 102 and second 116 sets of the plurality of leads having a substantially similar configuration. The step of shipping the main and neutral leads or lead assemblies is advantageous because this allows for the positioning of the main or neutral leads to be changed at the installation site. This advantageously decreases, or even eliminates, the undue cost and time delay associated with the need to change or reconfigure the pre-selected positions 72, 74 of the electrical connections to the power generator. Additionally, this application is related to U.S. Provisional application Serial No. 60/186,306 filed on Mar. 2, 2000 which is incorporated herein by reference. As also discussed and described in the provisional application, the present invention further provides methods of installing the main leads in a second configuration such that with no change to the power generator, the phase sequence delivered at the power connections will be reversed as compared to a first configuration as understood by those skilled in the art(see also FIGS. 20–21).

In the drawings and specification, there have been disclosed a typical preferred embodiment of the invention, and although specific terms are employed, the terms are used in a descriptive sense only and not for purposes of limitation. The invention has been described in considerable detail with specific reference to these illustrated embodiments. It will be apparent, however, that various modifications and changes can be made within the spirit and scope of the invention as described in the foregoing specification and as defined in the appended claims.

That claimed is:

1. A power generation system comprising:
    an outer housing;
    an inner housing positioned substantially within the outer housing so that an interstitial space is formed between inner surface portions of the outer housing and outer surface portions of the inner housing;
    a power generator having first and second side portions being horizontally opposed and positioned substantially within the inner housing;
    a plurality of main current transformers positioned in the interstitial space between the outer housing and the inner housing and connected to one of the respective first or second side portions of the power generator to transform current received from the power generator to a preselected output;
    a plurality of neutral current transformers positioned in the interstitial space between the outer housing and the inner housing and connected to one of the respective first or second side portions of the power generator so that each of the plurality of neutral current transformers is positioned substantially opposite each of the plurality of main side current transformers to transform current received from the power generator; and
    a lead subassembly interchangeability connector interchangeably connected between the respective plurality of main and neutral current transformers and the respective first and second side portions of the power generator to readily interchangeably connect a respective one of the plurality of the main or neutral current transformers to a respective first or second side portion of the power generator.

2. The power generation system as defined in claim 1, wherein said inner housing comprises opposing first and second sidewalls, wherein the lead subassembly interchangeability connector further comprises a pair of lead connector interfaces each connected to the opposing first and second sidewalls of the inner housing so that a first one of the pair of lead connector interfaces is positioned opposite a second one of the pair of lead connector interfaces, each one of the pair of lead connector interfaces comprising a first side positioned along an outer surface of a respective sidewall of the inner housing and a second side positioned along an inner surface of the respective sidewall of the inner housing, each one of the respective pair of opposing lead connector interfaces including a plurality of connectors positioned on the first and second sides of the pair of opposing lead connector interfaces, the plurality of connectors positioned on the first side of each of the pair of opposing lead connector interfaces electrically connected to the plurality of connectors positioned on the second side of each of the pair of opposing lead connector interfaces, the plurality of connectors positioned on the first and second sides of the first one of the pair of lead connector interfaces positioned in substantially the same locations as the plurality of connectors positioned on the first and second sides of the second one of the pair of lead connector interfaces so that the pair of lead connector interfaces are substantially similar in configuration and can thereby readily interchangeably connect one of the plurality of the respective main or neutral current transformers to one of the respective first or second side portions of the power generator, the plurality of connectors positioned on the second side of the lead connector interfaces connected to one of the respective first or second side portions of the power generator and the plurality of connectors positioned on the first side of the lead connector interfaces positioned opposite the plurality of connectors positioned on the second side of the lead connector interfaces and associated with a respective one of the plurality of main or neutral current transformers, each of the plurality of connectors positioned to readily interchangeably electrically connect the plurality of main or neutral current transformers to the first or second side portions of the power generator.

3. The power generation system as defined in claim 2, wherein the pair of lead assembly interchangeability connectors further comprises a first and a second set of a plurality of leads connected to the first side of each of the pairs of lead connector interfaces and extending therefrom to one of the respective plurality of main or neutral current transformers, each of the plurality of leads of the first and second sets of leads positioned to readily interchangeably be associated with one of the plurality of main or neutral side current transformers and one of the plurality of connectors positioned on the second side of one of the pairs of lead connector interfaces to thereby readily interchangeably connect to the first or second side portion of the power generator by interchangeably connecting to one of the plurality of connectors on one of the respective pair of lead connector interfaces.

4. The power generation system as defined in claim 3, wherein the power generator is an air cooled power generator allowing air to circulate within the inner housing to cool the power generation process therefor, and wherein each of the plurality of leads of the first and second sets of the plurality of leads further comprises a pair of conductors defined by a first and a second conductor, each having substantially the same shape, the first conductor positioned spaced-apart from the second conductor and wherein the first and second conductors extend substantially parallel from one of the plurality of main or neutral current transformers to the plurality of connectors positioned on the second side of one of the pairs of lead connector interfaces, and wherein a first pair of conductors associated with one of the plurality of the first set of the plurality of leads is shaped substantially similar to and positioned opposite a second pair of conductors associated with one of the plurality of the second set of the plurality of leads.

5. The power generation system as defined in claim 4, further comprising a plurality of lead subassembly platforms positioned in the interstitial space between the inner housing and the outer housing adjacent respective side portions of the power generator for supporting each of the respective plurality of main or neutral current transformers, and wherein each of the plurality of respective main or neutral current transformers is positioned spaced-apart and connected to a portion of each of the plurality of lead subassembly platforms that is distal from the outer surface portions of one of the sidewalls of the inner housing.

6. The power generation system as defined in claim 1, wherein the outer housing further comprises a bottom, a plurality of sidewalls connected to the bottom, and a top connected to each of the plurality of sidewalls and positioned to overlie the bottom.

7. The power generation system as defined in claim 6, wherein the inner housing further comprises a bottom positioned spaced-apart from and supported on the bottom of the outer housing, a plurality of sidewalls connected to the bottom of the inner housing, and a top connected to the plurality of sidewalls and positioned to overlie the bottom of the inner housing.

8. The power generation system as defined in claim 7, wherein the power generator includes a rotor and a multiphase stator surrounding at least portions of the rotor.

9. A power generation system comprising:
   an outer housing;
   an inner housing within the outer housing and defining an interstitial space therewith;
   a power generator within the inner housing and having first and second side portions being horizontally opposed;
   a plurality of main current transformers in the interstitial space adjacent the first side portion of the power generator;
   a plurality of neutral current transformers in the interstitial space adjacent the second side portion of the power generator; and
   a respective lead subassembly interchangeability connector for interchangeably connecting the main current transformers to the first side portion of the power generator and the neutral current transformers to the second side portion of the power generator.

10. The power generation system as defined in claim 9, wherein each lead subassembly interchangeability connector comprises a pair of lead connector interfaces each comprising a first side positioned along an outer surface of the inner housing and a second side positioned along an inner surface of the inner housing, each lead connector interface including a plurality of connectors positioned on the first and second sides thereof.

11. The power generation system as defined in claim 10, wherein each lead subassembly interchangeability connector further comprises a first and a second set of leads extending from the first side thereof.

12. The power generation system as defined in claim 11, further comprising a respective lead subassembly platform positioned in the interstitial space for supporting the main current transformers and the neutral current transformers.

13. The power generation system as defined in claim 9, wherein the power generator is an air cooled power generator allowing air to circulate within the inner housing.

14. The power generation system as defined in claim 9, wherein the outer housing comprises a bottom, a plurality of sidewalls connected to the bottom, and a top connected to each of the plurality of sidewalls and positioned to overlie the bottom.

15. The power generation system as defined in claim 14, wherein the inner housing comprises a bottom positioned spaced-apart from and supported on the bottom of the outer housing, a plurality of sidewalls connected to the bottom of the inner housing, and a top connected to the plurality of sidewalls and positioned to overlie the bottom of the inner housing.

16. The power generation system as defined in claim 9, wherein the power generator includes a rotor and a multiphase stator surrounding at least portions of the rotor.

* * * * *